US009507904B2

(12) United States Patent
Liu et al.

(10) Patent No.: US 9,507,904 B2
(45) Date of Patent: Nov. 29, 2016

(54) SYSTEM AND METHOD OF CIRCUIT LAYOUT FOR MULTIPLE CELLS

(71) Applicant: TAIWAN SEMICONDUCTOR MANUFACTURING COMPANY, LTD., Hsinchu (TW)

(72) Inventors: Chia-Chu Liu, Shin-Chu (TW); Kuei Shun Chen, Hsinchu (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 253 days.

(21) Appl. No.: 14/258,567

(22) Filed: Apr. 22, 2014

(65) Prior Publication Data
US 2014/0229905 A1 Aug. 14, 2014

Related U.S. Application Data

(62) Division of application No. 13/343,980, filed on Jan. 5, 2012, now Pat. No. 8,732,626.

(51) Int. Cl.
*G06F 17/50* (2006.01)
(52) U.S. Cl.
CPC ....... *G06F 17/5072* (2013.01); *G06F 17/5068* (2013.01)

(58) Field of Classification Search
CPC .................... G06G 17/5045; G06G 17/5068; G06G 17/5081; G06G 2217/12
USPC ........................ 716/52–55, 110–111, 119, 122
See application file for complete search history.

(56) References Cited

U.S. PATENT DOCUMENTS

| | | | |
|---|---|---|---|
| 5,612,893 A * | 3/1997 | Hao .................... | G06F 17/5081 716/135 |
| 2009/0222783 A1* | 9/2009 | Culp ................... | G06F 17/5068 716/122 |
| 2011/0296360 A1 | 12/2011 | Wang et al. | |
| 2012/0054696 A1 | 3/2012 | Su et al. | |
| 2013/0036397 A1* | 2/2013 | Lee .................... | G06F 17/5081 716/122 |

* cited by examiner

Primary Examiner — Paul Dinh
(74) Attorney, Agent, or Firm — Hauptman Ham, LLP

(57) ABSTRACT

A circuit layout method comprises inputting layout data into a circuit layout system. The layout data represents a plurality of patterns in a plurality of cells. Each pattern of the plurality of patterns has a plurality of runs, ends, and corners. The method also comprises specifying a plurality of G1-rule criteria. The method further comprises reviewing a representation of G0-space and G0 rule violations for each cell of the plurality of cells. The method additionally comprises inputting an adjustment to the layout data. The method also comprises reviewing a representation of adjusted cell edge spacings, and selecting to output a final layout.

20 Claims, 9 Drawing Sheets

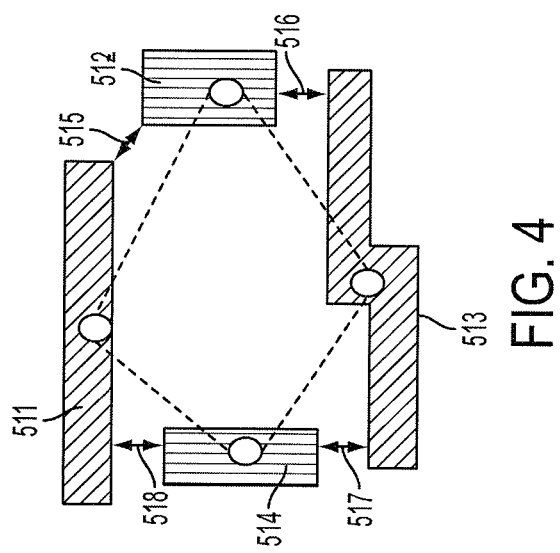

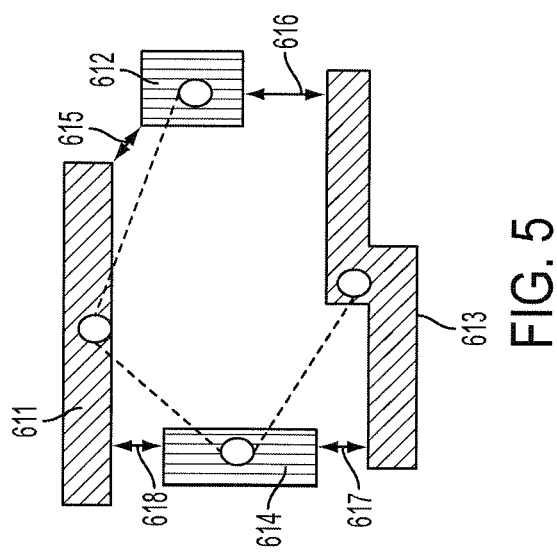

SYSTEM AND METHOD OF CIRCUIT LAYOUT FOR MULTIPLE CELLS

PRIORITY CLAIM

The present application is a divisional of U.S. application Ser. No. 13/343,980 (now U.S. Pat. No. 8,732,626), filed Jan. 5, 2012, which is incorporated by reference herein in its entirety.

TECHNICAL FIELD

The present disclosure relates to semiconductor fabrication generally and more specifically to double patterning.

BACKGROUND

In semiconductor fabrication processes, the photo resolution of a photoresist pattern begins to blur at about 45 nanometer (nm) half pitch. As feature sizes decrease to 20/22/14 nm and beyond, various methods are used to address the resolution issue. Particularly, double exposure techniques using two masks can circumvent the resolution limit.

Double exposure involves forming patterns on a single layer of a substrate using two different masks in succession. As a result, line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Unlike the 1-D approach of DDL, DPT in some cases allows a vertex (angle) to be formed of a vertical segment and a horizontal segment on the same mask. Thus, DPT generally allows for greater reduction in overall IC layout than DDL does. DPT is a layout splitting method analogous to a two coloring problem for layout splitting in graph theory. In its simplest form, the two coloring problem is a way of coloring the vertices (or edge or face) of a graph such that no two adjacent vertices share the same color. Two adjacent vertices connected with an edge should be assigned different colors. Only two "color types" can be assigned. If a 2 color solution exists, the graph is said to be 2-colorable.

An IC layout includes multiple patterns on many layers. The distance between adjacent elements may be too small to be on the same mask, referred to herein as G0-space, but not so small to be beyond the process capability of the technology node. Each pattern on a layer is assigned a first or second "color"; the patterns of the first color are formed by a first mask, and the patterns of the second color are formed by a second mask. DPT is computationally intensive because IC layouts have many solutions and each solution has different consequences and is evaluated separately. Layouts that cannot be simply resolved into two masks, i.e. not 2-colorable, are solved by moving one or more patterns or resizing one or more patterns.

Design Rule Checker (DRC) software can systematically check design rules by showing all G0-spaces in a layout design. A designer would enter the necessary design rules, referred to as a deck, into the DRC using its design rule language, such as Standard Verification Rule Format (SVRF) or a software specific Tool Command Language (TCL). The design rules would specify the criteria for a particular spatial relationship to be a G0-space, such as corner-to-corner distance, end-to-end distance, or run-to-end distance. The DRC software would then take the layout input in a standard format, such as Graphic Data System II (GDSII), and produce an output that shows all the spatial relationships that are G0-spaces. Commonly used DRC software includes Calibre by Mentor Graphics; Hercules by Synopsys; Diva, Dracula, Assura, and PVS by Cadence Design Systems.

If a layout cannot be separated into two masks, the problem can be addressed by changing the layout design, usually one cell at a time. A cell contains a number of related patterns that forms a simple circuit having shared input and/or output. The layout design is usually changed manually by a designer reviewing the G0-space output from a DRC software. Changing a layout design is time-consuming for large cells, because a designer aims to minimize the total volume of a cell and a change often affects structures in other layers. Once the layout design is changed for the cell, the layout design is propagated to the entire chip as the cell is often used in multiple instances.

BRIEF DESCRIPTION OF THE DRAWINGS

FIG. 4 shows layout patterns that form an even cycle loop.

FIG. 5 shows layout patterns that form a non-loop.

DETAILED DESCRIPTION

Figure 1:
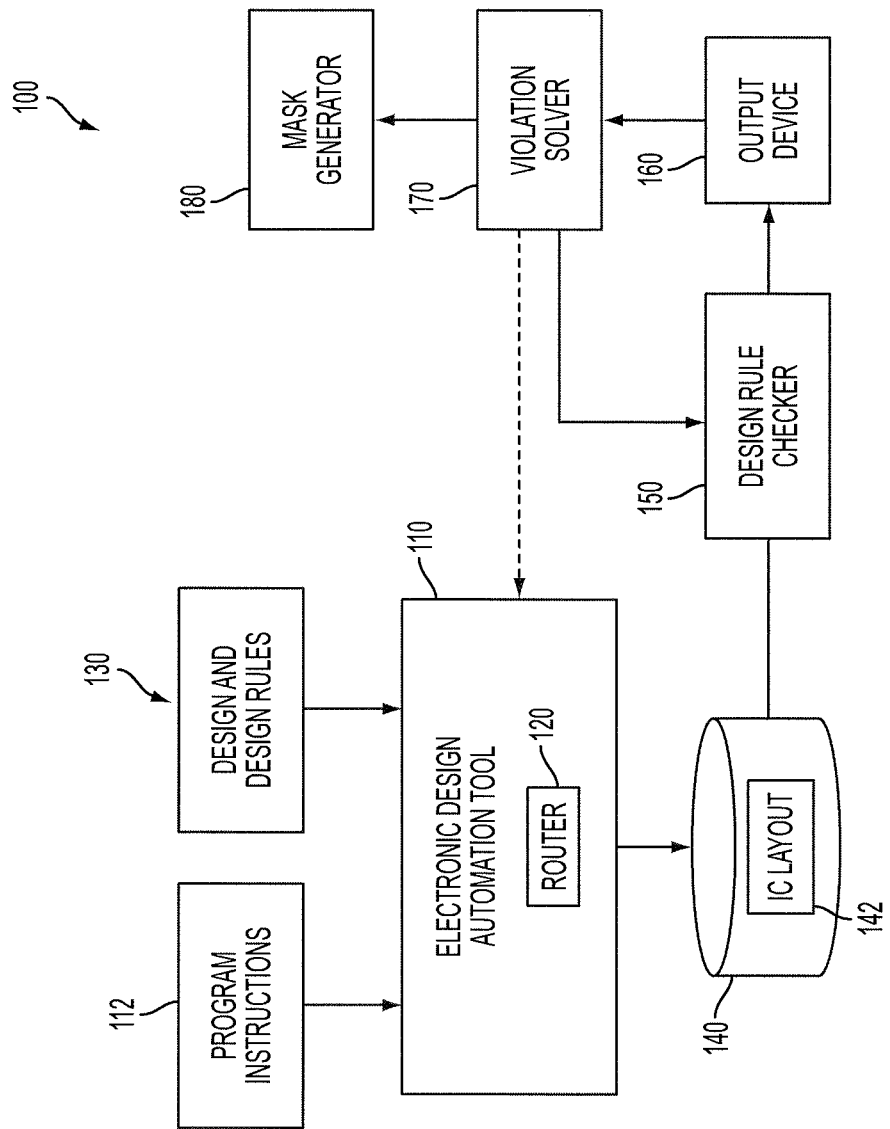
FIG. 1 is a block diagram of a system according to various embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 shows a system 100 having an electronic design automation (EDA) tool 110 that performs various electronic design processes for a electronic designer in order to automate many of the tasks during electronic design. The EDA tool 110 includes EDA software such as "IC COMPILER"™, sold by Synopsys, Inc. of Mountain View, Calif., including a router 120 such as "ZROUTE"™, also sold by Synopsis. Other EDA software may be used, such as the "VIRTUOSO" custom design platform or the Cadence "ENCOUNTER"® digital IC design platform may be used, along with the "VIRTUOSO" chip assembly router 120, all sold by Cadence Design Systems, Inc. of San Jose, Calif. The EDA tool 110 is a special purpose computer formed by retrieving stored program instructions from a computer readable storage medium 112 and executing the instructions pertaining to electronic design on a processor.

One or more computer readable storage media 112 and/or 130 are provided to store input data used by the EDA tool 110. The storage medium 130 and/or the storage medium 112 may include one or more of dynamic random access memory (RAM), SDRAM, a read only memory (ROM), EEPROM, a hard disk drive (HDD), an optical disk drive (CD-ROM, DVD-ROM or BD-ROM), or a flash memory, or the like. The physical storage media for program instructions 112 and design/design rules 130 may be the same or different media. The input data may include an identification of a plurality of cells to be included in an integrated circuit (IC) layout, including a list of pairs of cells within the plurality of cells to be connected to each other and other design information. The input data may also include design rules. Design rules may include default rules applicable to all designs or rules specific to a particular kind of design or the instant design.

A computer readable storage medium 140 is provided, for outputting an IC layout 142. The medium 140 may be a separate storage device, or a portion of the same storage medium 130 described above. The medium 140 may be any of the types of storage media described above with respect to medium 130.

The IC layout 142 is then checked for DPT compliance by the Design Rule Checker (DRC) software 150 for G0-space. The G0-space information is outputted in 160 to various output devices such as a printer, a screen, a graphic display device, or the like. Commonly, G0-spaces are simply highlighted in a layout diagram as shown in FIG. 3. According to various embodiments, the G0-space information is used by a violation solver 170 that changes one or more of the parameters and represents the layout to the design rule checker 150. In certain embodiments, the violation solver 170 is a circuit designer. In other embodiments, the violation solver 170 is a computer program, which may be a part of an EDA software. In some cases, sufficient parameters are changed such that the design returns to the EDA router 120 for re-routing and re-layout. Once the DRC clears the design of violations, the design is sent to a mask generator 180. The mask generator 180 generates the information necessary to physically form the photomasks. The mask information is sent to an entity that makes the photomasks for the semiconductor fabrication processes.

Figure 2:
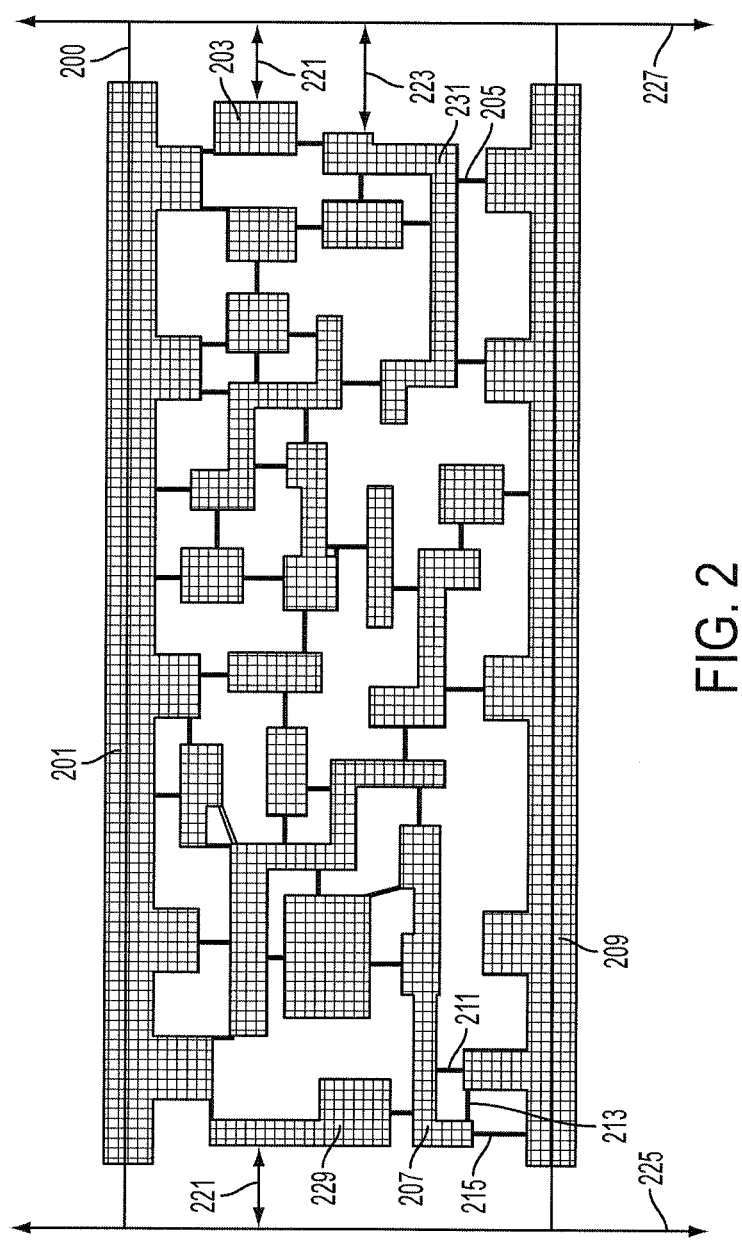
FIG. 2 is a layout of a cell with G0-spaces.

FIG. 2 shows a layout 200 for a particular layer in an integrated circuit. The layout includes various features such as 201, 203, 207, and 209. The features may be portions of interconnects in a particular metal layer or transistor features. G0-spaces are shown, in some embodiments, using a line between the violating elements, shown as 205, 211, 213, and 215.

Figure 3C:
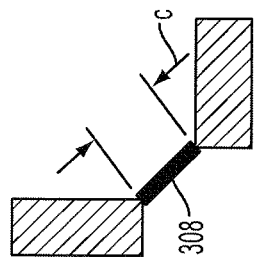
FIGS. 3A to 3C show relationships between patterns used in determining spacing for G0 rules.
Figure 3B:
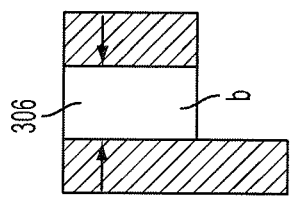
Figure 3A:
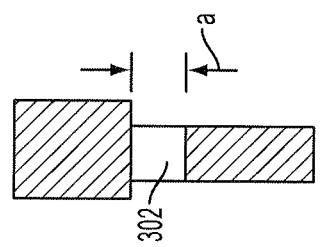

FIGS. 3A-3C define a set of G0 rules for determining whether a given set of patterns can be used in a DPT compliant routing pattern according to some embodiments. The parameter G0 is derived as a function of the minimum line spacing. FIGS. 3A to 3C show an example of a set of definitions of relevant line spacing criteria, given a minimum line spacing S defined by the routing grid. The minimum spacing S is a parameter of a particular process technology node. Criteria are applied to determine whether a given spatial relationship between two of the patterns in a routing layout would create a G0-space. For a region of the layout surrounded by a plurality of patterns, DPT may be possible if the number of G0 spaces surrounding the region of the layout is an even number. On the other hand, a 2-colorable layout is not achieved if the number of G0 spaces surrounding the region of the layout is an odd number.

In FIG. 3A, the G0-rule for end-end or end-run space is shown. A "G0 space" is formed in an area 302, for which the end-end or end-run distance is less than a parameter X times a minimum spacing S, or X*S. For example, if the distance is greater than 2.1*S (X=2.1), then these two patterns do not form a G0 space between them. If the distance is between S and 2.1*S, then a G0 space 302 is formed as shown in FIG. 3A. Note that the multiplier X may be different depending on a number of variables, for example, the wavelength of the lithographic radiation, the type of mask, etc. An even number of G0 spaces around a given region of the layout can nevertheless result in a 2-colorable layout. Thus a G0 space is formed when an end-to-end distance between two of the plurality of segments which are aligned with each other, or between two of the additional patterns which are aligned with each other, or between one of the plurality of segments and one of the additional patterns aligned therewith, to at least X times a minimum line spacing used between pairs of adjacent lines. Also, a G0 space is formed when an end-to-run distance between two of the plurality of segments which are unconnected and perpendicular to each other, or between two of the additional patterns which are unconnected and perpendicular to each other, or between one of the plurality of segments and one of the additional patterns which are unconnected and perpendicular to each other, to at least X times a minimum line spacing used between pairs of adjacent lines.

FIG. 3B shows the G0-rule for run-run space. A "G0 space" is formed in an area 306, for which the run-run distance is less than a parameter Y times a minimum spacing S, or Y*S. If the distance is greater than 1.6*S (Y=1.6), then these two patterns do not form a G0 space between them. If the distance is between S and 1.6*S, then an even number of G0 spaces around a given region of the layout can nevertheless result in a 2-colorable layout. Thus, a G0 space is formed if a run-to-run distance between two of the plurality of segments which are parallel to each other, or between two of the additional patterns which are parallel to each other, or between one of the plurality of segments and one of the additional patterns which are parallel to each other and extend, to at least Y times a minimum line spacing used between pairs of adjacent lines.

FIG. 3C shows the G0-rule for corner-corner space. A "G0 space" is formed in an area 308, for which the corner-corner distance is less than a parameter Z times a minimum spacing S, or Z*S. If the distance is greater than 1.6*S (Z=1.6), then these two patterns do not form a G0 space between them. If the distance is between S and 1.6*S, then an even number of G0 spaces around a given region of the layout can nevertheless result in a 2-colorable layout. Thus, a G0 space is formed when a corner-to-corner distance between two of the plurality of segments which are unconnected and perpendicular to each other, or between two of the additional patterns which are unconnected and perpendicular to each other, or between one of the plurality of segments and one of the additional patterns which are unconnected and perpendicular to each other, to at least Z times a minimum line spacing used between pairs of adjacent lines.

The descriptions of FIGS. 3A-3C above are non-limiting examples. Different technologies may use different threshold values for identifying a G0-space, including different S values and multipliers X, Y, and Z. That is, in other embodiments, the threshold distance may differ from 1.6*S or 2.1*S (e.g., 1.8*S, 2.4*S, or the like). In some embodiments, the G0 threshold may be a constant number regardless of the minimum spacing S. In other embodiments, the G0 threshold may use the same multiple of S (e.g., 2.1*S) for all types of spacing. In still other embodiments, alternate or additional examples of G0-space may be identified, such where a layout includes lines that are not either perpendicular or parallel to each other.

As discussed, an odd-cycle loop is not 2-colorable, but an even-cycle loop is. A loop is where the G0-spaces among polygons form a cyclic sequence. As described above, patterns across a G0-space should be split into different masks. Because the odd-cycle loop has a number of polygons that cannot be split into two masks, it has a native conflict, or a G0-rule violation. FIG. 4 shows a four-pattern loop. The patterns are 511, 512, 513, and 514 having four G0-spaces 515, 516, 517, and 518 between them. Working through the loop clockwise, patterns 511 and 512 should be separated into two masks because they have G0-space 515 between them. For example, pattern 511 is assigned to mask A (hatch pattern) and pattern 502 assigned to mask B (vertical pattern). Similarly, patterns 512 and 513 should be separated into two masks because they have G0-space 516 between them. Because pattern 512 is assigned to mask B, then 513 should be assigned to mask A. Again, patterns 513 and 514 should be separated into two masks because they have G0-space 517 between them. Because pattern 513 is already assigned to mask A, then 514 should be assigned to mask B. Lastly, patterns 514 and 511 should be separated into two masks because they have G0-space 518 between them. Because pattern 514 is assigned to mask B, then 511 should be assigned to mask A, which it already is. Thus, the loop as shown in FIG. 4 is 2-colorable, or separable into two masks. FIG. 4 includes four patterns, forming an even-loop. Whenever G0-spaces form an even loop, the patterns can be separated into two masks and is 2-colorable.

In some cases, the relations of G0-spaces do not form a cyclic sequence. The arrangement of patterns is referred to as a non-loop, as shown in FIG. 5. FIG. 5 shows patterns 611, 612, 613, and 614 with G0-spaces 615, 617, and 618. The space 616 between patterns 612 and 613 is not a G0-space because the distance between the patterns exceeds X*S, as described above in relation to FIG. 3A. The patterns and G0-spaces in FIG. 5 do not form a cyclic sequence because not all legs of the imaginary polygon are G0-spaces. Thus, the patterns form a non-loop. Non-loops are not G0-rule violations no matter how many legs they have because they can always be separated into two masks.

Various methods are used to resolve patterns in a cell into two masks. Some of the methods are disclosed in U.S. patent application Ser. No. 12/788,789, filed May 27, 2010, by inventor Dio Wang, et al., which is incorporated herein by reference for all purposes. Particularly, some of these methods identify critical G0-spaces and present them to a designer for resolution. A designer may move patterns further away from each other or change the dimensions of one or more of the patterns forming the critical G0-space. In some cases, the presentation of critical G0-spaces includes options for resolving the critical G0-spaces. The methods may also include having a system propagating the solution to other layers and pointing out rule violations if the particular solution is adapted. This way, the designer can choose the best solution that involves fewest changes in the overall layout. If a satisfactory solution cannot be found by moving specific patterns or changing the shape of one or more patterns, additional space may be allocated for the cell and the entire cell area expanded. Once a solution is found for a cell, the changes are propagated to all like cells. Because cells are often repeated in a circuit design, a designer does not have to solve the same critical G0-spaces over and over again. Like cells include cells having the same layout, cells that are mirror images of each other, and/or cells that are rotational images of each other because the two mask solution for them are the same.

Referring back to FIG. 2, a cell 200 is shown having various patterns. Cell edges 225/227 and metal lines 201 and 209 define a boundary of the cell 200. Depending on the location and function of the cell 200, metal lines 201 and 209 may extend to the cell edges 225/227. The cell 200 includes many internal patterns and edge patterns. An edge pattern is a pattern with one of its sides exposed to a cell edge. For example, patterns 229 and 207 are edge patterns for cell 200 next to cell edge 225; and, patterns 203 and 231 are edge patterns for cell 200 next to cell edge 227. A distance between the edge pattern and the cell edge is defined as the distance between the closest side of the edge pattern to the cell edge. Pattern 203 is at a distance 221 away from the cell edge 227; and, pattern 231 is at a distance 223 away from the same cell edge 227. The side of pattern 231 closest to the cell edge 227 has two faces, each having a different distance to the cell edge 227. The shorter distance 223 is considered the distance between pattern 231 and cell edge 227.

Edge pattern that is the closet pattern to the cell edge is a "near edge pattern." In FIG. 2, pattern 203 is the near edge pattern for cell edge 227. Edge patterns that are not the closest pattern to the cell edge and have a G0-space relationship to the near edge pattern are "next edge patterns." In FIG. 2, pattern 223 is further away from the cell edge 227 than pattern 203. Pattern 223 is a next edge pattern. There may be multiple near edge patterns and next edge patterns for a cell edge. Multiple near edge patterns occur when more than one edge pattern have an equal distance from the cell edge when no other edge pattern is closer to the cell edge. Multiple next edge patterns occur when more than one edge pattern is not a near edge pattern. The distances 221 and 223 are known as cell edge spacings. Depending on the technology node of the semiconductor process, a minimum value is defined for cell edge spacing.

Figure 6:
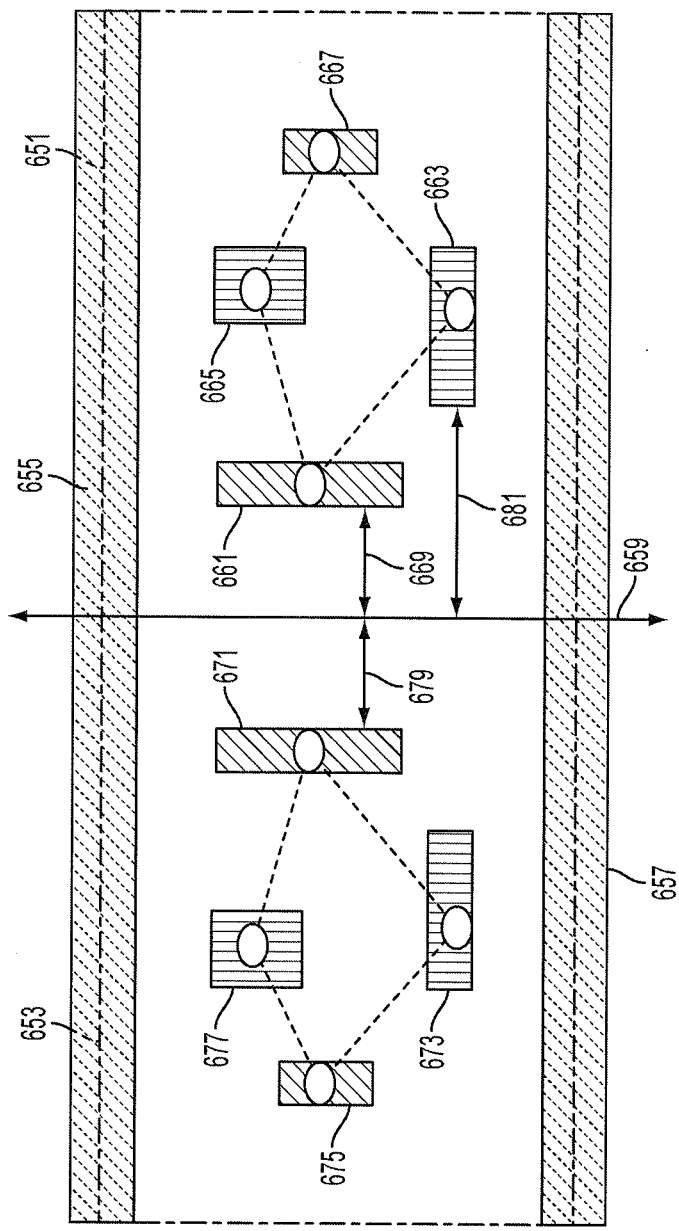
FIG. 6 shows a layout of two abutting cells.

FIG. 6 shows an example of two abutting cells 651 and 653 sharing a cell edge 659. In this example, the abutting cells 651 and 653 also share metal power lines 655 and 657, though not all abutting cells would necessarily share power lines. Cell 651 includes 4 patterns 661, 663, 665, and 667, separated into two masks A and B. Patterns 661 and 667 are designated to one mask, for example, mask A, while patterns 663 and 665 are designated to another mask, for example, mask B. The patterns in cell 651 are related to each other by at least one G0-space, forming a four sided polygon as shown.

Cell 653 includes 4 patterns 671, 673, 675, and 677, separated into two masks A and B. Patterns 671 and 675 are designated to one mask, for example, mask A, while patterns 673 and 677 are designated to another mask, for example, mask B. The patterns in cell 653 are related to each other by at least one G0-space, forming a four sided polygon as shown. Patterns 661 and 663 are edge patterns for the shared cell edge 659 in cell 651. Edge pattern 661 is at a distance 669 away from the shared cell edge 659; and, edge pattern 663 is at a distance 681 away from the shared cell edge 659. Edge pattern 661 is a near edge pattern. Edge pattern 663 is a next edge pattern for cell edge 659 because pattern 661 is closer to the shared cell edge 659. Similarly, for cell 653, patterns 671 and 673 are edge patterns for the shared cell edge 659. In cells 651 and 653, the distances 679 and 669 are greater than a minimum cell edge spacing. The distance between the near edge patterns 671 and 661 is therefore the sum of cell edge spacings 679 and 669.

In this example, cells 651 and 653 are mirror image cells. Each of the patterns in one of the cells has a counterpart pattern in the abutting cell in a mirror image position. When cell designs are reused, the DPT mask designations are often also reused so that the counterpart pattern is designated in the same mask as its counterpart in the abutting cell. For the near edge patterns, they often are designated in the same mask, as shown in FIG. 6 for patterns 671 and 661. In this example, patterns 671 and 661 are both designated for mask A. Because these two patterns are in the same mask, the distance between them cannot be a G0-space. In other words, the sum of distances 679 and 669 can only be greater than a G0-space.

Figure 7:
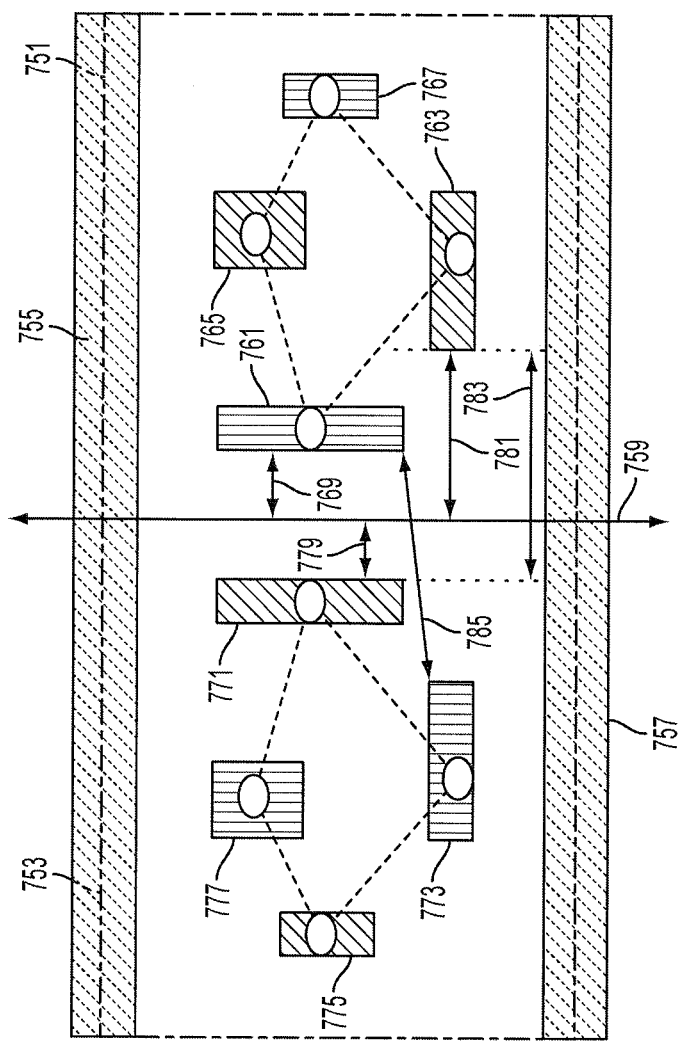
FIG. 7 shows a layout of two abutting cells with near edge patterns assigned to different masks in accordance with various embodiments of the present disclosure.

FIG. 7 shows another example of two abutting cells 751 and 753 sharing a cell edge 759 in accordance with various embodiments of the present disclosure. In this example, the abutting cells 751 and 753 also share metal power lines 755 and 757. Cell 751 includes 4 patterns 761, 763, 765, and 767, separated into two masks A and B. Patterns 761 and 767 are designated to one mask, for example, mask A, while patterns 763 and 765 are designated to another mask, for example, mask B. The patterns in cell 751 are related to each other by at least one G0-space, forming a four sided polygon as shown. Cell 753 includes 4 patterns 771, 773, 775, and 777, separated into two masks A and B. Patterns 771 and 775 are designated to one mask, for example, mask B, while patterns 773 and 777 are designated to another mask, for example, mask A. The patterns in cell 753 are related to each other by at least one G0-space, forming a four sided polygon as shown. Patterns 761 and 763 are edge patterns for the shared cell edge 759 in cell 751. Edge pattern 761 is at a distance 769 away from the shared cell edge 759; and, edge pattern 763 is at a distance 781 away from the shared cell edge 759. Edge pattern 761 is a near edge pattern for cell edge 759. Edge pattern 763 is a next edge pattern for cell edge 759 because pattern 761 is closer to the shared cell edge 759. Similarly, for cell 753, patterns 771 and 773 are edge patterns for the shared cell edge 759. In cells 751 and 753, the distances 769 and 779 are greater than a minimum cell edge spacing. The distance between the near edge patterns 761 and 771 is therefore the sum of cell edge spacings 769 and 779.

In this example, cells 751 and 753 are mirror image cells. Each of the patterns in one of the cells has a counterpart pattern in the abutting cell in a mirror image position, for example, patterns 761 and 771 are counterpart patterns. In this example, counterpart patterns are designated to different masks—near edge pattern 761 is assigned to mask A and near edge pattern 771 is assigned to mask B. Because these two patterns are in different masks, the distance between these edge patterns 761 and 771 can be a G0-space. In other words, the sum of distances 779 and 779 can less than the sum of cell edge spacings 669 and 679 as long as the sum of distances 779 and 779 is greater than a minimum line spacing.

While the example of FIG. 7 shows abutting cells that are mirror image cells, not all abutting cells are mirror images. They may be two completely different cells or have some other kind of symmetry, for example, a rotational symmetry. They may also be repeating cells having no internal symmetry.

In accordance with various embodiments of the present disclosure, the minimum cell edge spacings in two abutting cells such as cells 651 and 653 can be reduced by changing the mask designation of one of the cells so that the near edge pattern in each of the cells are assigned to different masks. According to various embodiments, the cell edge spacings (for example, 679 and 669 of FIG. 6) is reduced to half of the minimum line spacing when the mask assignment is switched, as long as the distance between the next edge pattern and the near edge pattern in the abutting cell is greater than a G0-space. Depending on the technology node, the minimum line spacing may be 40 nm, 28 nm, 24 nm, 20 nm, 18 nm, 14 nm, or less.

In some embodiment in accordance with the present disclosure, if the cell edge spacing is reduced to half of the minimum line spacing, but the spacing between the next edge pattern and the near edge pattern in the abutting cell is smaller than a specified value, then a G1-rule violation is created. The G1-rule allows certain spacing between a next edge pattern and the shared cell edge, or between a next edge pattern and the near edge pattern of the abutting cell. The spacing between the next edge pattern and the shared cell edge is a G1-rule edge spacing. The G1-rule edge spacing is a distance between the next edge pattern and the cell edge defined by the distance between the closest side of the next edge pattern to the cell edge.

In the example of FIG. 7, distance 781 is a G1-rule edge spacing. The spacing between the next edge pattern and the near edge pattern of the abutting cell is a G1-rule pattern spacing. In FIG. 7, the distance between pattern 771 and pattern 763 is the G1-rule pattern spacing. In some embodiments, the G1-rule pattern spacing is the distance between a side of the pattern closest to the shared cell edge of each pattern. In these embodiments, a distance between two lines representing the side of the pattern closest to the shared cell edge is determined to be the G1-rule pattern spacing. In FIG. 7, this G1-rule pattern spacing between patterns 763 and 771 is shown as spacing 783. In some other embodiments, the G-1 rule pattern spacing is determined using a shortest spacing between run and run, run and end, end and end, and corner and corner of the next edge pattern and the other cell near edge pattern. In FIG. 7, this spacing between patterns 773 and 761 is distance 785 as measured from corner to corner. Note that different determination of G1-rule pattern spacing results different values. Although the corner to corner determination is more representative of the actual spacing between the patterns, various embodiments use the side to side determination for ease of calculation. With the side by side determination, only the distance in one axis is determined.

The specified value for the G1-rule violation is related to the lithography process and may be the same as that for a G0-space. Because the next edge pattern and the near edge pattern across the shared cell edge are most likely assigned to the same mask, the spacing between them cannot be a G0-space. In some embodiments, the specified value for G1-rule pattern spacing is about 70 nm, and the specified value for G1-rule edge spacing is about 60 nm. However, as lithography techniques improve, smaller specified values may be used.

If changing the cell edge spacing creates a G1-rule violation, the cell edge spacing or the next edge pattern is adjusted to fix the G1-rule violation. In certain embodiments, the entire cell is moved, or the cell edge spacing increased, until the G1-rule violation is gone. This method resolves all G1-rule violations and usually creates cell edge spacings that are still smaller than the original cell edge spacings. Another equivalent method is to reduce cell edge spacings until the G1-rule pattern spacing or G1-rule edge spacing is about to be violated.

In some embodiments, the designer may aim to minimize cell area. In these embodiments, cell to cell spacing may be reduced further by adjusting the next edge pattern. The next edge pattern that cause the G1-rule violation may be moved away from the shared cell edge, as long as minimum spacing requirements with other adjacent patterns are not violated and that propagation of the change to other layers do not cause unresolvable issues. The shape of the next edge pattern may be adjusted, by increasing its length the G1-rule pattern. Referring to FIG. 7, if spacing between near edge pattern 761 and next edge pattern 773 violates a G1-rule, then cell spacing 779 may be increased, near edge pattern 773 may be removed further away from the cell edge, and near edge pattern 773 may be shortened.

In still other embodiments, the near edge pattern may be moved further away from the next edge pattern or vice versa. Referring to FIG. 7, if the distance 785 is used to determine G1-rule pattern spacing, then the near edge pattern 761 may be moved along the shared cell edge 759 toward the metal line 755 while keeping the cell edge spacing 769 the same. Moving the near edge pattern 761 up would increase distance 785. Conversely, next edge pattern 773 may be moved along the shared cell edge 759 toward the metal line 757 to the same effect. Note that if the G1-rule pattern spacing is determined using side to side distance, then these moves would not cause the value to change.

An EDA tool is used to make changes to the layout. In some embodiments, the EDA tools allow a designer to reduce cell edge spacings by changing mask assignments where necessary and moving the cells closer together without a G1-rule violation by writing special formulas. In other embodiments, the EDA tools include such functionality so that a designer can reduce cell edge spacings and propagate changes to other layers upon selecting the function.

In still other embodiments, the EDA tools include functionality to further minimize cell spacing. An iterative method may be used where the smallest cell edge spacing is tried first. If G1-rule violations are created, an EDA tool may suggest alternative fixes and show what propagation to other layers would look like. The designer can choose whether and which fix to be applied to the layout. If fixing the G1-rule violations cause too many issues, a designer can choose to relax the cell edge spacing a little bit and try to reduce or find better fixes for G1-rule violations. This process can iterate until an acceptable solution with a minimum cell edge spacing is found. Once an acceptable solution is found, it can be propagated to all like cell pairs-two abutting cells that have the same layout and relationship as the solved cell pair.

Figure 8:
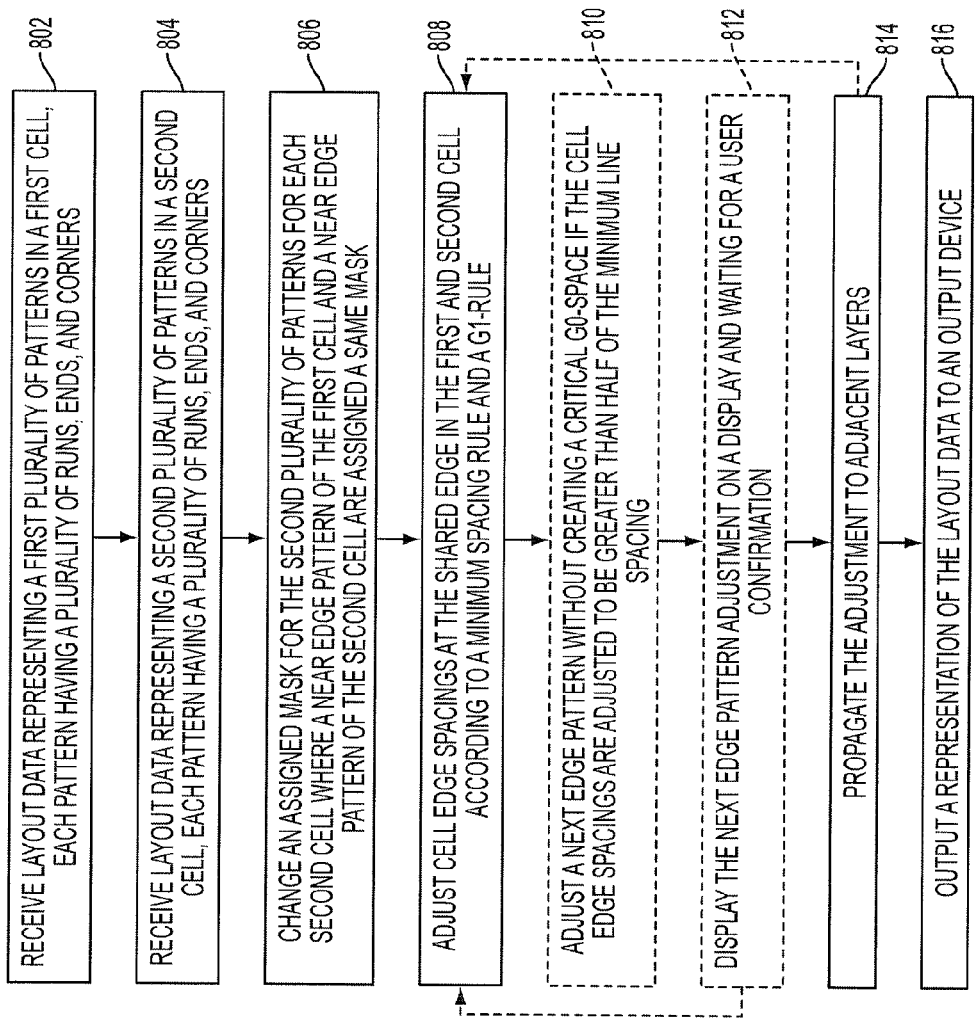
FIG. 8 is a flow chart of a method in accordance with some embodiments of the present disclosure.

FIG. 8 is a flow chart of a circuit layout method in accordance with some embodiments. In operation 802, layout data representing a first plurality of patterns in a first cell is received. The layout data includes information about each pattern such as runs, ends, and corners locations and sizes. The layout data may include a number of layers having different patterns that may be connected through the layers. The layout data may be generated by an electronic design automation (EDA) tool such as "SYNPHONY" from Synopsis, "VIRTUOSO" from Cadence Systems, and "IC STATION" from Mentor Graphics. The layout data may be provided using a computer readable medium using a standard layout format such as GDSII. The layout data may also be provided directly through software interface when the method is executed by an EDA system.

The first plurality of patterns for the first cell is separated into mask A and mask B such that the first cell has no critical G0-space. As discussed, separating the patterns may involve simply assigning alternating masks to patterns related by a G0-space. For more complicated cells, separating the patterns may also involve fixing some critical G0-spaces. The method embodiment of FIG. 8 uses cells having patterns already separated into two masks; however, in some embodiments, the operation of separating the patterns into two masks may be included.

In operation 804, layout data representing a second plurality of patterns in a second cell is received. The layout data for the first cell and the second cell may be received together one transmission, upload, generation, input or data read. Just like the first cell, the second cell includes patterns already assigned to one of two masks and has no remaining critical G0-space.

The first cell and the second cell abut each other, having a shared cell edge. As shown in FIGS. 2, 6, and 7, the cells are bordered by two cell edges and two metal lines. As used and defined in this disclosure, cells abut each other if they share one cell edge. Other adjacent cells may share one metal line, but for the purpose of this disclosure these other adjacent cells do not abut.

In operation 806, an assigned mask for the second plurality of patterns is changed to the other mask for each second cell where a near edge pattern of the first cell and a near edge pattern of the second cell are assigned to a same mask. An example of this operation is FIG. 6 to FIG. 7. In FIG. 6, the near edge pattern 671 and a near edge pattern 661 are both assigned to mask A. In FIG. 7, the mask for the patterns in one of the cell is changed to the other mask. All patterns in cell 651 formerly assigned to mask A are changed to mask B in cell 751. All patterns in cell 651 formerly assigned to mask B are changed to mask A in cell 751. The result is having the near edge pattern of the cells be in different masks, as shown in FIG. 7. Note that this operation may not apply in all cases. For example, the near edge cells may already be in different masks. In those cases no reassignment of the masks is performed.

Referring back to FIG. 8, in operation 808, the cell edge spacings at the shared edge in the first and second cell are adjusted according to a minimum spacing rule and a G1-rule. When the near edge patterns in abutting cells are assigned to different masks, the cell edge spacing can be set to half of the minimum line spacing or the cell edge spacing that would meet the G1-rule, whichever is greater. Referring back to FIG. 7, cell edge spacings 769 and 779 can be set to half of the minimum line spacing as long as the G1-rule is also met. The minimum line spacing is technology node dependent and describes the minimum spacing required between two patterns. When both cell edge spacings 769 and 779 are set to half minimum line spacing, the distance between them is the minimum line spacing.

The G1-rule may be satisfied in several ways. In some embodiments, the G1-rule requires a minimum distance between a next edge pattern and the cell edge. An example is distance 781 of FIG. 7. This distance is referred to as the G1-rule edge spacing. In some embodiments, the G1-rule requires a minimum distance between a next edge pattern and the near edge pattern in the abutting cell. Examples include distance 783 and 785 of FIG. 7. These distances are referred to as the G1-rule pattern spacing. Note that the G1-rule pattern spacing may be determined a number of ways. One example is the distance 783 determined using a distance between two lines formed by the sides of the respective patterns that are closest to the cell edge. Another example is a corner to corner distance between the two patterns such as distance 785.

Generally, a minimum value for the cell edge spacing is half of the minimum line spacing. Cell edge spacing at this minimum value reduces overall circuit size the most. However, satisfying the G1-rule may cause the cell edge spacing to be greater than half of the minimum line spacing. If the G1-rule comes into play, then optional operation 810 and 812 may be performed to minimize the cell edge spacing.

Referring back to FIG. 8, in optional operation 810 a next edge pattern is adjusted. The next edge pattern may be adjusted by moving the pattern, changing a size of the pattern, or in some circumstances moving other patterns and changing a size of the other patterns. Once the next edge pattern is adjusted, the operation 808 is revisited to adjust cell edge spacings. In some embodiments, optional operation 812 may be performed where the next edge pattern adjustment may be displayed on a display for a user confirmation. When the confirmation is given, then the adjustment is performed. If the user does not confirm, the previous adjustment from operation 808 would not be changed. These operations may be repeated, one next edge pattern at a time, until the cell edge spacing cannot be reduced any further. In some embodiments, all of the next edge patterns are adjusted at the same time.

If the next edge pattern adjustment creates a critical G0-space, the critical G0-space is resolved before proceeding to the next operation. If the critical G0-space cannot be resolved, then another next edge pattern adjustment is made.

In operation 814, the adjustments are propagated to other layers. According to certain embodiments, when an adjustment is made for cell edge spacing, the spacings in other layers are also changed. In some cases a line between cells, such as the metal lines 755 and 757 are shortened. According to some embodiments, the next edge patterns are adjusted and propagated to other layers. For example, an adjustment may be entered for a pattern that affects patterns in some, but not all, other layers. The EDA tool may propagate the adjustment to adjacent layers until all affected layers are adjusted. For example, a designer may choose to reduce a pattern area and enters this adjustment on one layer. However, the pattern is a trench that is physically connected to vias in adjacent layers. Then the vias should be moved or removed and any further interconnect that the vias connect to must also be moved or reshaped. In other embodiments, the EDA tool would rely on the designer to manually enter adjustments for all affected layers. The EDA tool may also issue warnings that the adjustment causes a misalignment of other patterns on other layers and highlight those for subsequent resolution. In certain cases, the adjustment propagation may not be possible, for example, because the adjustment in subsequent layers would violate design rules that have no fixes. In those cases, the method loops back to operation 808 where the adjustment is changed, as shown by the dotted line arrow.

In operation 816, a presentation of the new, adjusted, layout is outputted to an output device. The representations may be sent to a machine-readable storage medium, i.e., memory, such as a memory chip, a disk and/or a drive or to a display device, such as a monitor or a printer. The output may be a graphical representation similar to that of FIG. 7, or a computer generated code with layers and patterns presented with various attributes, such as location and size. The representation of the layout is then used to create a photolithography masks for creating the patterns in photoresist. The mask may be created by an entity different from the electronic designer, or in the case of some foundries with electronic design and mask making capability, be created by the same entity.

In one aspect according to some embodiments, the present disclosure pertains to a system for creating an IC layout. The system includes a computer readable storage medium, a processor coupled to read the storage medium, and an output device. The computer readable storage medium may include one or more of dynamic random access memory (RAM), SDRAM, a read only memory (ROM), EEPROM, a hard disk drive (HDD), an optical disk drive (CD-ROM, DVD-ROM or BD-ROM), or a flash memory, or the like.

The processor may be part of a special purpose computer for design rule checking configured to perform various methods as disclosed herein. In certain embodiments, the processor is configured to assign the patterns in each cell into two masks, fix all critical G0-spaces in each cell, propagate the critical G0-space fixes to other layers in the layout, for each second cell where a near edge pattern of the first cell and a near edge pattern of the second cell are assigned to a same mask, change an assigned mask for the second plurality of patterns, minimize cell edge spacings in the first and second cell according a minimum spacing rule and a G1-rule, and output a representation of the layout data to an output device. In some embodiments, fixing all critical G0-space includes determining whether a G0-space associated with a G0 rule violation is a critical G0-space, determining a potential fix for at least one critical G0-space, outputting the G0-rule violations, critical G0-spaces, and the potential fix to an output device, receiving a selection of the potential fix via from the input device; and, outputting the representation incorporating the fix to an output device. In some embodiments, minimizing cell edge spacings in the first and second cell according a minimum spacing rule and a G1-rule includes adjusting cell edge spacings in the first and second cell according a minimum spacing rule; increasing a G1-rule spacing between a next edge pattern if the adjusted cell spacing creates a G1-rule violation; fixing an next edge pattern critical G0-space if the increased G1-rule spacing causes one or more next edge pattern critical G0-spaces to form; and, adjusting cell edge spacings in the first and second cell according to the G1-rule if the one or more next edge pattern critical G0-spaces cannot be fixed.

The output device may be a display, a printer, or the computer storage medium. The system may further include an input device for entering the layout data and/or adjustment to the layout data during one or more iterative resolution of the layout. Using the system, a designer may perform a process such as that of FIG. 9 in accordance with various embodiments of the present disclosure.

Figure 9:
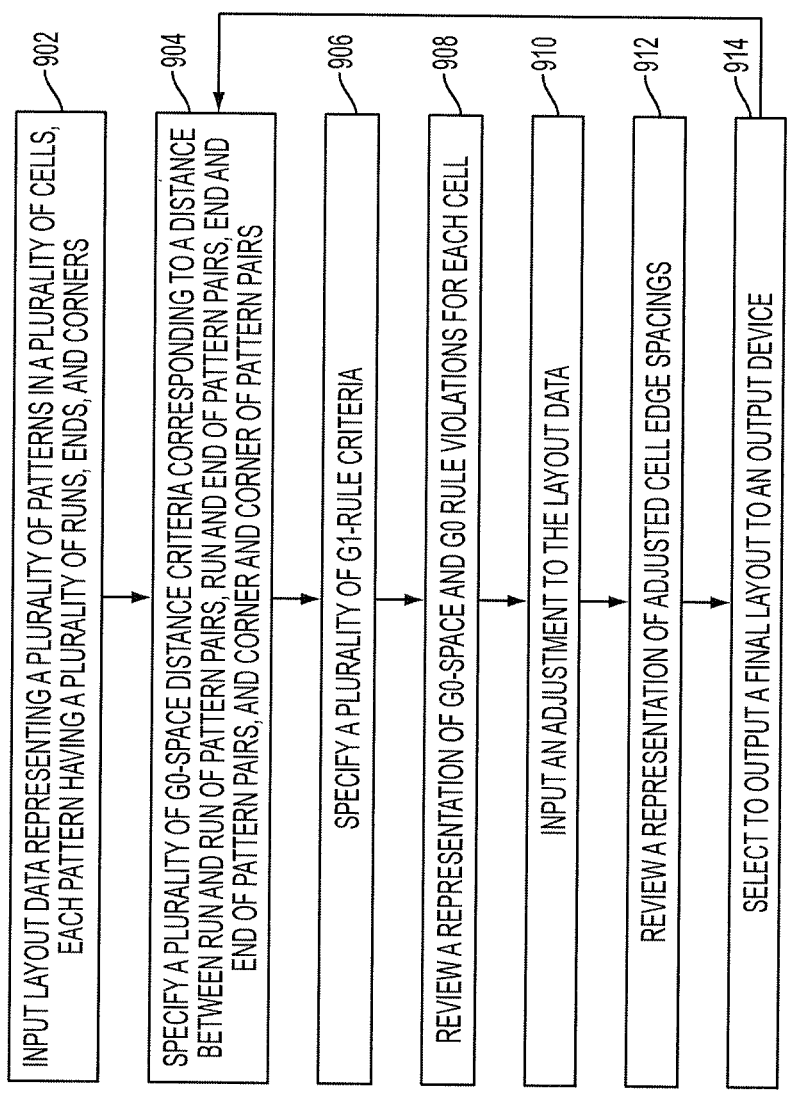
FIG. 9 is a flow chart of a method in accordance with some embodiments of the present disclosure.

The process of FIG. 9 describes design rule check (DRC) process in addition to the method of FIG. 8 from the perspective of the electronic designer. In operation 902, the designer input layout data representing a plurality of patterns in a plurality of cells, each pattern having a plurality of runs, ends, and corners. This input layout data is often a product of one or more software programs that takes an electronic design and convert it to a layout representing semiconductor features. An example of the software program is an electronic design compiler and router. In some embodiments, the designers may electronically draw the layout using the EDA tools.

In operation 904, the designer specifies a plurality of G0-space distance criteria corresponding to a distance between run and run of pattern pairs, run and end of pattern pairs, end and end of pattern pairs, and corner and corner of pattern pairs. In operation 906, the designer specifies a number of G1-rule criteria. These specifications in operation 904 and 906 may be performed by simply selecting a default design rule deck that would apply to most IC designs for a particular technology node, or be manually entered and customized by the designer. In operation 908, the designer reviews a representation of G0-space and G0 rule violations for each cell. While the number of cells may be numerous, most of the cells are of a few repeating types. Some may require the designer to decide which alternative fix to make, some may require no change. The designer input adjustments to the layout data in operation 910 using the G0-rule violation information. Once all the G0-rule violations are resolved, the patterns in each cell are assigned to one of two masks by the EDA tool. The mask designations between abutting cells are analyzed by the EDA tool and where near edge patterns have been assigned to the same mask, the patterns in one of the cells are assigned to the other mask. The EDA tool also makes adjustments to the cell edge spacings based on the G1-rule criteria and minimum spacing rules for the design. In operation 912, the designer reviews a representation of adjusted cell edge spacings. If the adjustments are satisfactory, then in operation 914 the designer select to output a final layout to an output device, which may be a display, a printer, or a computer storage medium.

In some embodiments, the next edge patterns are adjusted to minimize cell edge spacings, confirming one of the one or more next edge pattern adjustments, and reviewing a representation of minimized cell edge spacings.

One aspect of this description relates to a circuit layout method that comprises inputting layout data into a circuit layout system. The layout data represents a plurality of patterns in a plurality of cells. Each pattern of the plurality of patterns has a plurality of runs, ends, and corners. The method also comprises specifying a plurality of G1-rule criteria. The method further comprises reviewing a representation of G0-space and G0 rule violations for each cell of the plurality of cells. The method additionally comprises inputting an adjustment to the layout data. The method also comprises reviewing a representation of adjusted cell edge spacings, and selecting to output a final layout.

Another aspect of this description relates to circuit layout method that comprises re-assigning a first set of mask patterns to a second mask and a second set of mask patterns to a first mask based on a determination that a near edge pattern of a first cell and a near edge pattern of a second cell are both assigned to the first mask or the second mask. The method also comprises adjusting cell edge spacings, using a computer, at the shared edge in the first and second cell according to a minimum spacing rule and a G1-rule. The G1-rule is a distance between a next edge pattern of the first cell and the shared edge or between the next edge pattern of the first cell and the near edge pattern of the second cell, and the next edge pattern of the first cell is different from the near edge pattern of the first cell. The method further comprises outputting a representation of layout data representing the first cell and the second cell having adjusted cell edge spacings.

A further aspect of this description relates to system that comprises a computer readable storage medium containing data representing an integrated circuit (IC) layout. The layout comprises, in one layer, a plurality of cells having patterns having a plurality of runs, ends, and corners. The system also comprises a processor coupled to read the storage medium, the processor configured to process received input layout data related to the IC layout having one or more cells to determine if any G0-space and G0 rule violations exist for each cell of the plurality of cells. The processor is also configured to generate a representation of determined G0-space and G0 rule violations for each cell. The processor is further configured to process received adjustment data to adjust cell edge spacing in the layout data to correct determined G0-space and G0 rule violations for each cell. The adjustment data is in compliance with at least one G1-rule. The processor is additionally configured to generate a representation of adjusted cell edge spacings, and to output a final layout.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, means, methods, and steps described in the specification. As one of ordinary skill in the art will readily appreciate from the disclosure of the present invention, processes, machines, manufacture, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit layout method comprising:
   inputting layout data into a circuit layout system, said layout data representing a plurality of patterns in a plurality of cells, each pattern of the plurality of patterns having a plurality of runs, ends, and corners;
   identifying a next edge pattern within a cell of the plurality of cells, wherein the next edge pattern is not a pattern closest to an edge of the cell of the plurality of cells;
   inputting an adjustment to the layout data based on at least one of
      whether a spacing between the next edge pattern and the edge of the cell of the plurality of cells is less than a first predetermined distance, or
      whether a spacing between the next edge pattern and a closest pattern within another cell of the plurality of cells is less than a second predetermined distance;
   outputting a representation of adjusted cell edge spacings; and
   outputting a final layout based at least in part on the adjustment for implementation in a semiconductor fabrication process.

2. The circuit layout method of claim 1, further comprising:
   confirming the adjustment;
   outputting a representation of minimized cell edge spacings based on the confirmed adjustment; and
   fabricating a semiconductor device based on the final layout.

3. The circuit layout method of claim 1, wherein the edge of the cell of the plurality of cells abuts an edge of the another cell of the plurality of cells.

4. The circuit layout method of claim 1, wherein cell edge spacings are adjusted to make each cell of the plurality of cells compliant with an edge spacing rule.

5. The circuit layout method of claim 1, wherein the first and second predetermined distances are specified within a default design rule check.

6. The circuit layout method of claim 1, wherein the first and second predetermined distances are specified within a customized design rule check.

7. A system comprising:
a computer readable storage medium containing data representing an integrated circuit (IC) layout, said layout comprising, in one layer, a plurality of cells having patterns having a plurality of runs, ends, and corners; and
a processor coupled to read the storage medium, the processor configured to:
process received input layout data related to the IC layout having one or more cells to determine if any spacing rule violations exist for each cell of the plurality of cells;
process received adjustment data to adjust cell edge spacing in the layout data to correct determined spacing rule violations for each cell, wherein the received adjustment data is directed at adjusting at least one of
a spacing distance between a next edge pattern and an edge of a cell of the plurality of cells, or
a spacing distance between the next edge pattern and a closest pattern within another cell of the plurality of cells,
wherein the next edge pattern is not a pattern closest to the edge of the cell of the plurality of cells;
generate a representation of adjusted cell edge spacings based on at least the adjustment data; and
output a final layout based at least in part on the representation of adjusted cell edge spacings.

8. The system of claim 7, wherein the final layout is output to a display, a printer, or the computer-readable storage medium and utilized to fabricate a semiconductor device.

9. The system of claim 7, further comprising an input device, wherein the processor is configured to:
determine whether a space associated with a determined spacing rule violation is a critical space;
determine a potential fix for at least one critical space;
output the determined spacing rule violation, the at least one critical space, and the potential fix to an output device;
receive a selection of the potential fix from the input device; and
output the representation incorporating the potential fix to the output device.

10. The system of claim 7, wherein processing received adjustment data comprises:
adjusting cell edge spacings in a first and a second cell of the plurality of cells according to a minimum spacing rule;
increasing a spacing from the next edge pattern if an adjusted cell edge spacing creates a spacing rule violation;
fixing a next edge pattern critical space if the increased spacing causes one or more next edge pattern critical spaces to form; and
adjusting cell edge spacings in the first and second cell of the plurality of cells according to an edge spacing rule if the one or more next edge pattern critical spaces cannot be fixed.

11. The system of claim 7, wherein the processor is further configured to process the received input layout data related to the IC layout based on a default design rule check.

12. The system of claim 7, wherein the processor is further configured to process the received input layout data related to the IC layout based on a specified custom design rule check.

13. A circuit layout method comprising:
inputting layout data into a circuit layout system, said layout data representing a plurality of patterns in a plurality of cells, each pattern of the plurality of patterns having a plurality of runs, ends, and corners;
specifying a plurality of criteria for pattern pairs of the plurality of patterns;
specifying a plurality of criteria for next edge patterns, wherein next edge patterns are patterns that are not closer to an edge of a cell than one other pattern of the cell, and the plurality of criteria for next edge patterns includes a spacing distance from at least one next edge pattern to a cell edge;
inputting an adjustment to the layout data based on a representation of rule violations for each cell of the plurality of cells to output a representation of adjusted cell edge spacings; and
outputting a final layout based at least in part on the adjustment for implementation in a semiconductor fabrication process.

14. The circuit layout method of claim 13, wherein specifying the plurality of criteria for pattern pairs comprises specifying distances between run and run of pattern pairs, run and end of pattern pairs, end and end of pattern pairs, and corner and corner of pattern pairs.

15. The circuit layout method of claim 13, further comprising:
outputting a representation of one or more next edge pattern adjustments based on the input adjustment;
confirming one of the one or more next edge pattern adjustments;
outputting a representation of minimized cell edge spacings based on the confirmed one of the one or more next edge pattern adjustments; and
fabricating a semiconductor device based on the final layout.

16. The circuit layout method of claim 13, wherein the plurality of criteria for next edge patterns comprise a distance between a next edge pattern of a first cell of the plurality of cells and a shared edge or between the next edge pattern of the first cell and a near edge pattern of a second cell of the plurality of cells.

17. The circuit layout method of claim 13, wherein specifying the plurality of criteria for next edge patterns comprises selecting a default design rule check.

18. The circuit layout method of claim 13, wherein specifying the plurality of criteria for next edge patterns comprises specifying a customized design rule check.

19. The circuit layout method of claim 13, wherein specifying the plurality of criteria for pattern pairs comprises selecting a default design rule check.

20. The circuit layout method of claim 13, wherein specifying the plurality of criteria for pattern pairs comprises specifying a customized design rule check.

* * * * *